(12) United States Patent
Bugyik (10) Patent No.: US 8,138,830 B2
(45) Date of Patent: Mar. 20, 2012

(54) VARIABLE GAIN INSTRUMENTATION AMPLIFIER

(75) Inventor: Paul L Bugyik, Reseda, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/418,408

(22) Filed: Apr. 3, 2009

(65) Prior Publication Data

US 2010/0259323 A1 Oct. 14, 2010

(51) Int. Cl.
*H03F 3/45* (2006.01)
(52) U.S. Cl. .......................................... 330/69; 330/301
(58) Field of Classification Search .................. 330/69, 330/86, 260, 282, 301
See application file for complete search history.

(56) References Cited

U.S. PATENT DOCUMENTS

| | | | | |
|---|---|---|---|---|
| 3,629,719 A * | 12/1971 | Heller et al. | ..................... | 330/69 |
| 4,337,441 A * | 6/1982 | Kellogg | ........................ | 330/261 |
| 4,451,779 A | 5/1984 | Griep | | |
| 4,833,422 A * | 5/1989 | Atwell | ........................ | 330/254 |
| 5,568,561 A * | 10/1996 | Whitlock | ....................... | 330/69 |
| 5,684,431 A * | 11/1997 | Gilbert et al. | ................ | 330/254 |
| 6,032,109 A * | 2/2000 | Ritmiller, III | ................. | 702/104 |
| 6,396,343 B2 * | 5/2002 | Chee | ............................... | 330/69 |
| 6,489,845 B1 | 12/2002 | Maschhoff | | |
| 6,876,070 B1 | 4/2005 | Gerstenhaber et al. | | |
| 2006/0130583 A1 | 6/2006 | Nakayama | | |

FOREIGN PATENT DOCUMENTS

| | | |
|---|---|---|
| EP | 0112115 | 6/1984 |
| WO | WO9820615 | 5/1998 |
| WO | WO03049282 | 6/2003 |

OTHER PUBLICATIONS

International Search Report and Written Opinion—PCT/US2010/029862, International Search Authority—European Patent Office—Oct. 1, 2010.
Seifart, Manfred: "Analoge Schaltungen" 1994, Verlag technik GmbH , Berlin , XP002593519 ISBN: 3-341-01089-0 , pp. 318-324 p. 232, line 1-line 2; figures 12.7 a,b.

* cited by examiner

*Primary Examiner* — Khanh Nguyen
(74) *Attorney, Agent, or Firm* — Ramin Mobarhan (57) ABSTRACT

Techniques for providing an instrumentation amplifier having a plurality of selectable gain settings. In an exemplary embodiment, a gain adjustment block for accepting a differential input voltage is coupled to a differential-to-single-ended conversion block for generating a single-ended output voltage. The gain adjustment block may have a plurality of gain settings selectable by one or more switches. The instrumentation amplifier advantageously offers precise gain control without the need for external calibration, while being robust and simple to design.

9 Claims, 6 Drawing Sheets

VARIABLE GAIN INSTRUMENTATION AMPLIFIER

BACKGROUND

1. Field

The disclosure relates to amplifier design, and more particularly, to techniques for designing a variable gain instrumentation amplifier.

2. Background

In the design and testing of integrated circuits (IC's), an instrumentation amplifier may be used to buffer the output of one or more pins of an IC prior to interfacing with various laboratory test equipment. In some applications, the instrumentation amplifier may provide a preselected amplification gain to a differential voltage from two differential output pins of the IC, and also convert the amplified differential voltage into a single-ended voltage to interface with the test equipment.

When selecting from amongst a plurality of possible gain settings, it may be important for the instrumentation amplifier to avoid introducing any systematic gain offsets between gain settings. To guarantee precise gain for a plurality of gain settings, prior art techniques may resort to the use of external calibration and/or trimming. Such procedures undesirably complicate the use of the instrumentation amplifiers.

It would be desirable to provide a simple and robust instrumentation amplifier having a plurality of selectable gain settings that can provide precise gain values without the need for external calibration.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
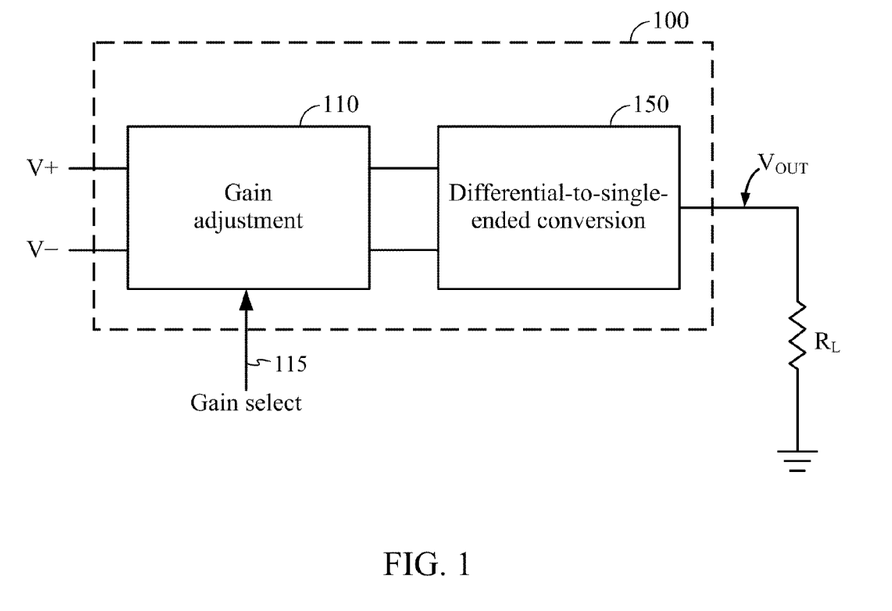
FIG. 1 illustrates an exemplary embodiment of an instrumentation amplifier according to the present disclosure.

FIG. 1 illustrates an exemplary embodiment 100 of an instrumentation amplifier according to the present disclosure. In FIG. 1, input voltages $V^+$ and $V^-$ are provided as a differential input voltage to an instrumentation amplifier 100. The amplifier 100 includes a gain adjustment block 110 for adjusting a gain applied to the differential input voltage, followed by a differential-to-single-ended conversion block 150 for converting the differential output voltage of the gain adjustment block 110 to a single-ended output voltage Vout. Vout is supplied to a load characterized by a load resistance $R_L$.

The gain adjustment block 110 accepts a gain select signal 115 to adjust the gain provided to the differential input voltage.

In an exemplary embodiment, the input voltages $V^+$ and $V^-$ may be supplied by output pins of an integrated circuit, while the single-ended output voltage Vout may drive subsequent loads such as test measurement equipment. In this way, the instrumentation amplifier 100 may also function as a buffer to prevent excessive loading to the pins of an integrated circuit during testing, as such pins may typically have only limited output drive capability.

Figure 2:
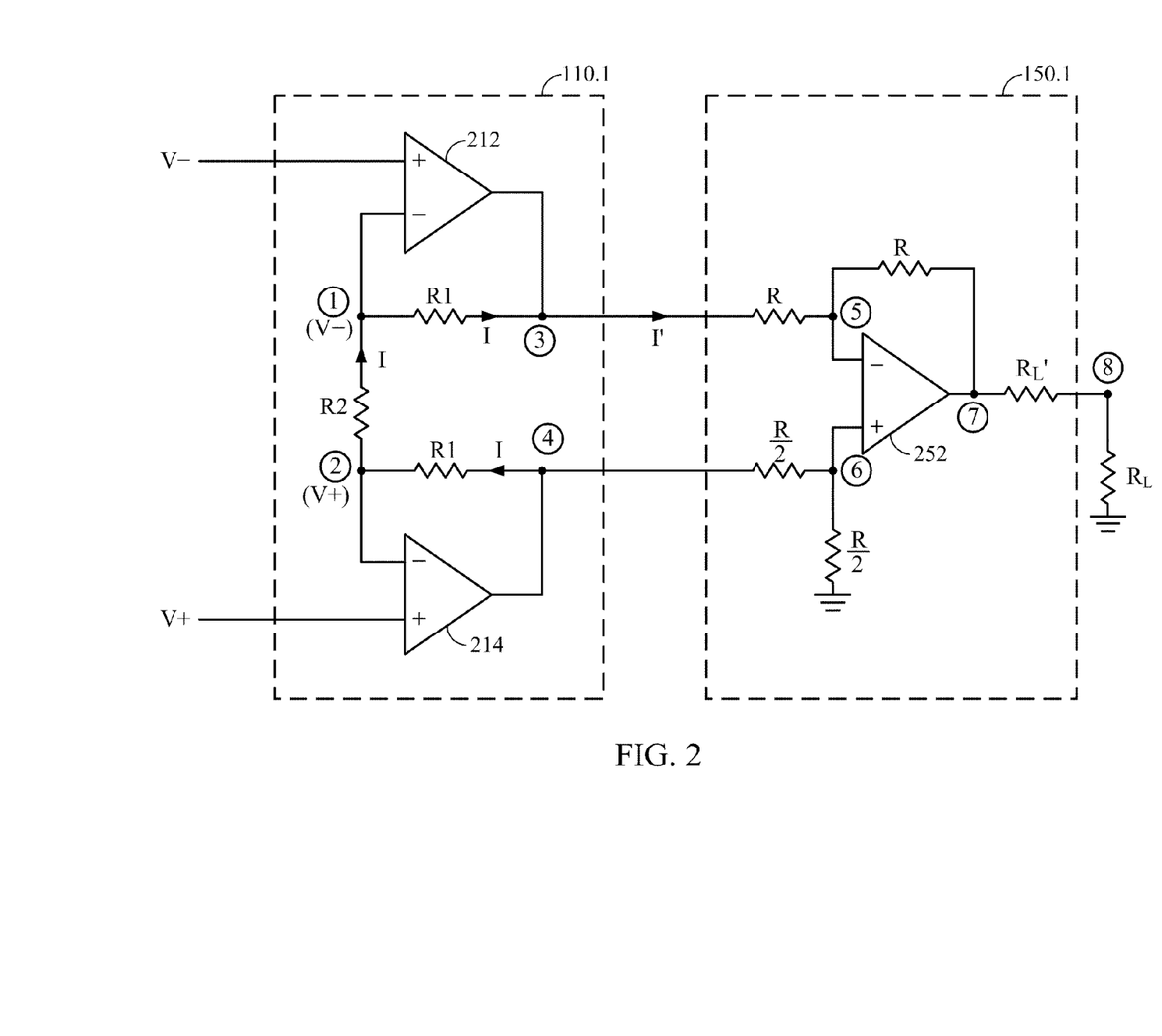
FIG. 2 illustrates an exemplary embodiment of a gain adjustment block and a differential-to-single-ended conversion block according to the present disclosure.

FIG. 2 illustrates an exemplary embodiment of a gain adjustment block 110.1 and a differential-to-single-ended conversion block 150.1 according to the present disclosure.

The gain adjustment block 110.1 includes operational amplifiers (op amps) 212 and 214. Each op amp has positive and negative input terminals, and a single-ended output terminal. Op amps 212 and 214 are each configured with negative feedback, and function as further described hereinbelow.

Op amp 212 receives the input voltage V− from FIG. 1 at its positive (+) input terminal, while op amp 214 receives the input voltage $V^+$ at its positive (+) input terminal. In FIG. 2, a resistance R1 is provided between the output terminal of each op amp 212, 214, and its respective negative (−) input terminal. The negative (−) input terminals of the op amps 212, 214 are further coupled to each other by a resistance R2. The ratio R1/R2 is herein defined as a.

Due to the negative feedback provided by the resistor configuration, the voltage at each op amp's negative (−) input terminal is assumed to be equal to the voltage at its corresponding positive (+) terminal. In particular, the voltage at node 1 (wherein a labeled node is circled in the figures) is assumed to be equal to $V^-$, while the voltage at node 2 is assumed to be equal to $V^+$.

The current I flowing in resistor R2 is thus equal to $(V^+ - V^-)/R2$, and the voltages at node 3 and node 4 may correspondingly be expressed as follows:

$$\text{Voltage at node } 3 = V^- - I \cdot R1$$
$$= V^- - (V^+ - V^-) \cdot (R1/R2)$$
$$= (1+\alpha) \cdot V^- - \alpha V^+; \text{ and}$$
$$\text{Voltage at node } 4 = V^+ + I \cdot R1$$
$$= V^+ + (V^+ - V^-) \cdot (R1/R2)$$
$$= (1+\alpha) \cdot V^+ - \alpha V^-.$$

As further shown in FIG. 2, the differential-to-single-ended conversion block 150.1 includes op amp 252, which is configured to be coupled to the voltages at nodes 4 and 3 at its positive and negative input terminals, respectively, and to generate an output voltage at node 7. Op amp 252 is configured with negative feedback, and its corresponding operational voltages and currents are as follows:

$$\text{Voltage at node } 6 = (1/2) \cdot \text{Voltage at node } 4;$$

$$\text{Voltage at node } 5 = \text{Voltage at node } 6;$$

$$I' = (\text{Voltage at node } 3 - \text{Voltage at node } 5)/R;$$

$$\begin{aligned}\text{Voltage at node } 7 &= \text{Voltage at node } 5 - I' \cdot R \\ &= 2 \cdot \text{Voltage at node } 5 - \text{Voltage at node } 3 \\ &= \text{Voltage at node } 4 - \text{Voltage at node } 3 \\ &= (1+\alpha) \cdot V^+ - \alpha V^- - (1+\alpha) \cdot V^- + \alpha V^+ \\ &= (1+2\alpha) \cdot (V^+ - V^-); \text{ and}\end{aligned}$$

$$\begin{aligned}\text{Voltage at node } 8 \text{ (Vout)} &= (1/2) \cdot \text{Voltage at node } 7; \\ &= 0.5 \cdot (1+2\alpha) \cdot (V^+ - V^-) \\ &= (0.5 + \alpha) \cdot (V^+ - V^-);\end{aligned}$$

wherein the last expression for Vout assumes the presence of a resistance $R_L'$ matched to the load $R_L$, at the output of instrumentation amplifier 100, to divide the voltage at node 7 in half for node 8.

Based on the preceding description, it will be appreciated that the ratio $\alpha$ between the resistances R1 and R2 controls a gain $(0.5+\alpha)$ of the instrumentation amplifier 100. Representative values of $\alpha$ include, for example, $\alpha=0.5$, corresponding to a total gain of 1 (0 dB), and/or any other value.

Note in an exemplary embodiment, the resistance presented at node 3 by the differential-to-single-ended conversion block 150.1 may preferably be kept equal to the resistance at node 4 presented by the differential-to-single-ended conversion block 150.1. As shown in FIG. 2, this may be accomplished by choosing the resistance between node 5 and node 3 to be a value R, and by choosing the total resistance (due to the series combination of the two resistances R/2) between node 4 and ground to also be R. By making the resistance presented at node 3 the same as the resistance presented at node 4, the differential-to-single-ended conversion block 150.1 may advantageously present a balanced differential load to the gain adjustment block 110.1.

One of ordinary skill in the art will appreciate that by balancing the differential load to the gain adjustment block 110.1 as previously described, as well as by selecting the feedback resistance from each op amp output terminal to its respective negative (−) input terminal to have a common value R1 as shown, common-mode rejection of the instrumentation amplifier 100 may advantageously be improved.

In an exemplary embodiment of the present disclosure, the instrumentation amplifier 100 may be provided with a single constant gain setting, e.g., a total gain of 1 achieved by setting $\alpha=0.5$. In alternative exemplary embodiments of the present disclosure, a plurality of gain settings may be achieved by, e.g., varying the ratio $\alpha$ between the resistances R1 and R2 using any techniques known to one of ordinary skill in the art. Such techniques may preferably keep the net resistance $2 \cdot R1+R2$ approximately constant for all adjustable ratios $\alpha$. For example, in an exemplary embodiment (not shown), one or more potentiometers may be used to adjust the ratio $\alpha$ to select a gain setting, while keeping the net resistance constant.

Figure 3:
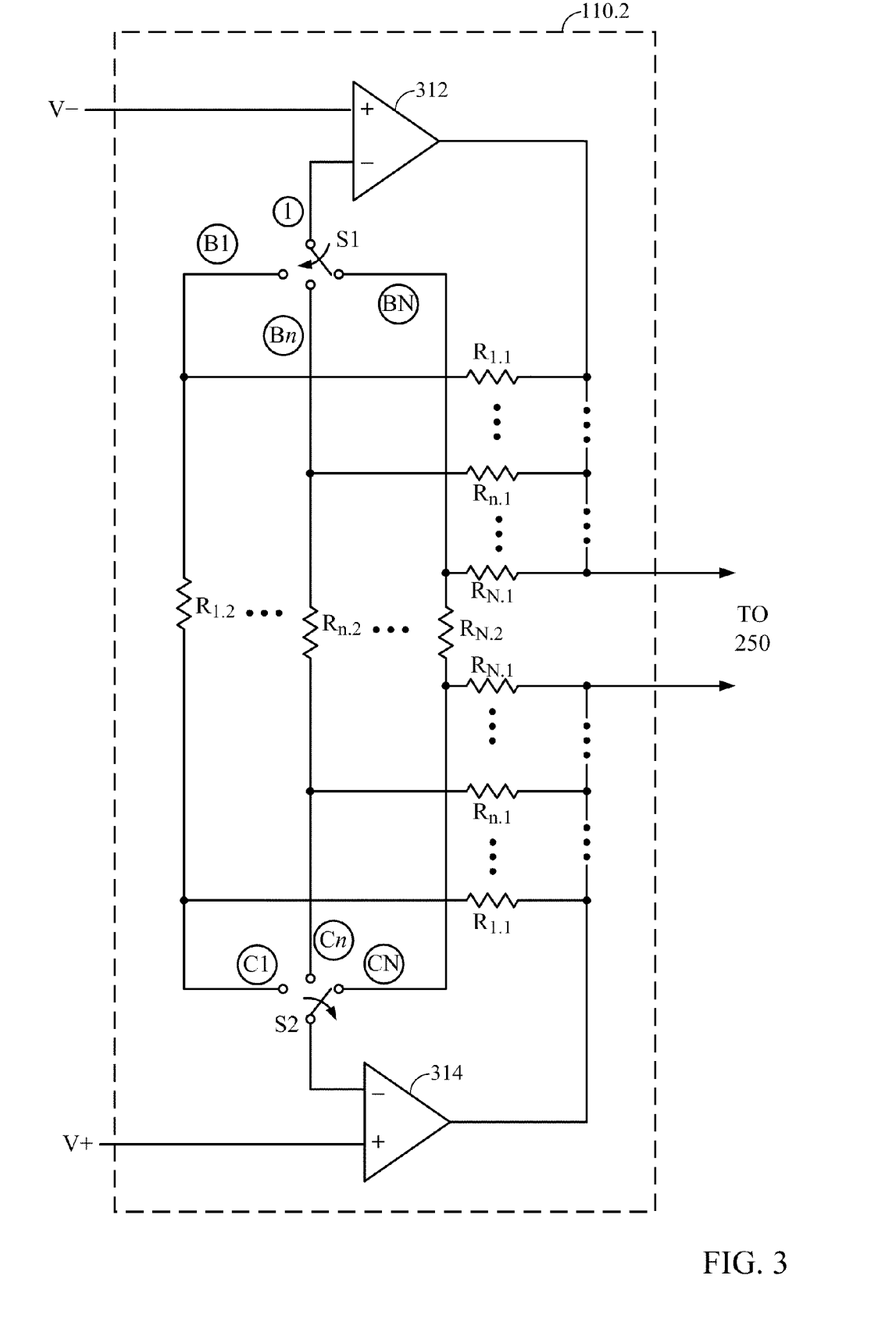
FIG. 3 illustrates an alternative exemplary embodiment of a gain adjustment block for providing a discrete plurality of gain settings by varying the ratio α between the resistances Rn.1 and Rn.2.

FIG. 3 illustrates an alternative exemplary embodiment of the present disclosure for providing a discrete plurality of gain settings using a plurality N of switchable feedback paths. For each feedback path n, corresponding resistances Rn.1 and Rn.2 may be provided, and the ratio $\alpha$ may therefore take on a distinct value an for each path n. Note the exemplary embodiment in FIG. 3 is shown for illustrative purposes only, and is not meant to limit the scope of the present disclosure to any particular implementation of a gain adjustment block 110.

In FIG. 3, op amps 312 and 314 perform similar functions to op amps 212 and 214 shown in FIG. 2. The negative input terminal of op amp 312 is coupled to a switch S1, which is configurable to select a first node Bn from amongst a plurality of nodes B1, ..., BN, the first node Bn corresponding to a gain adjustment path n. The negative input terminal of op amp 314 is similarly coupled to a switch S2, which is programmable to select a second node Cn corresponding to the gain adjustment path n selected by the switch S1. From the description given hereinabove with reference to FIG. 2, one of ordinary skill in the art will appreciate that when switches S1, S2 are configured to select a particular set of nodes Bn, Cn, respectively, corresponding to a gain adjustment path n, the gain adjustment block 110.3 functions in the same manner as described for the gain adjustment block 110.2 of FIG. 2 having a single gain adjustment path, with a selected ratio an corresponding to Rn.1/Rn.2. By setting appropriate values for the resistances Rn.1 and Rn.2 of each gain adjustment path n, any ratio an $\in \alpha 1, \ldots, \alpha N$ may be selected for the gain adjustment block 110.3.

In an exemplary embodiment, the sum of the resistances $2 \cdot Rn.1+Rn.2$ of each gain adjustment path n may be kept approximately constant across all gain adjustment paths 1 to N. This may advantageously reduce any differences in the offset voltage of the amplifier 100 across gain settings.

Figure 4:
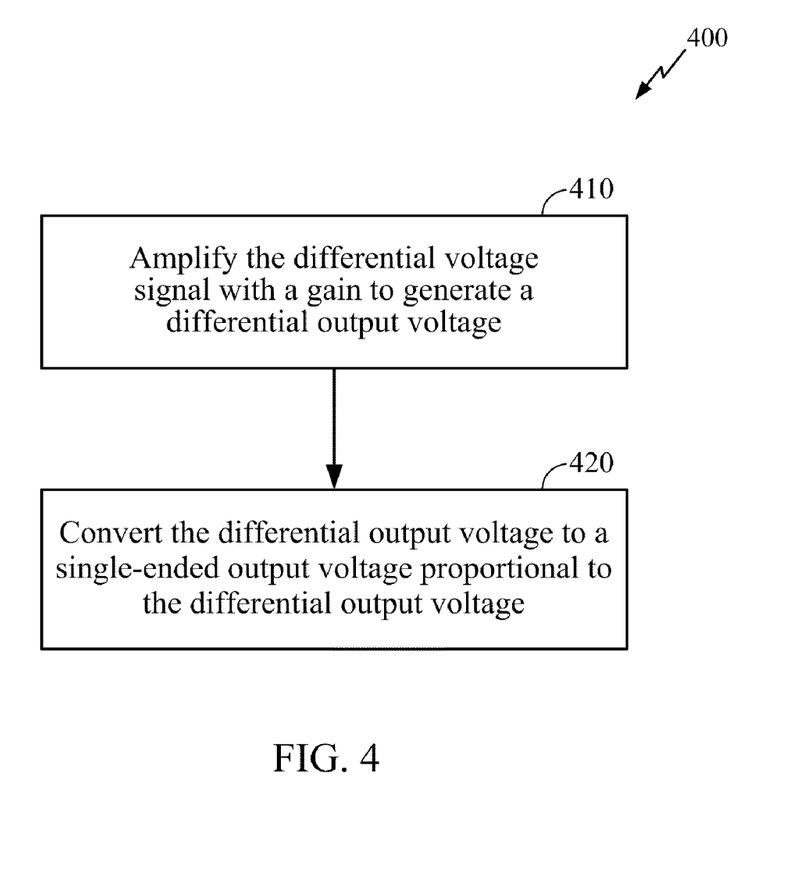
FIGS. 4, 4A, and 4B illustrate an exemplary embodiment of a method according to the present disclosure.
Figure 4A:
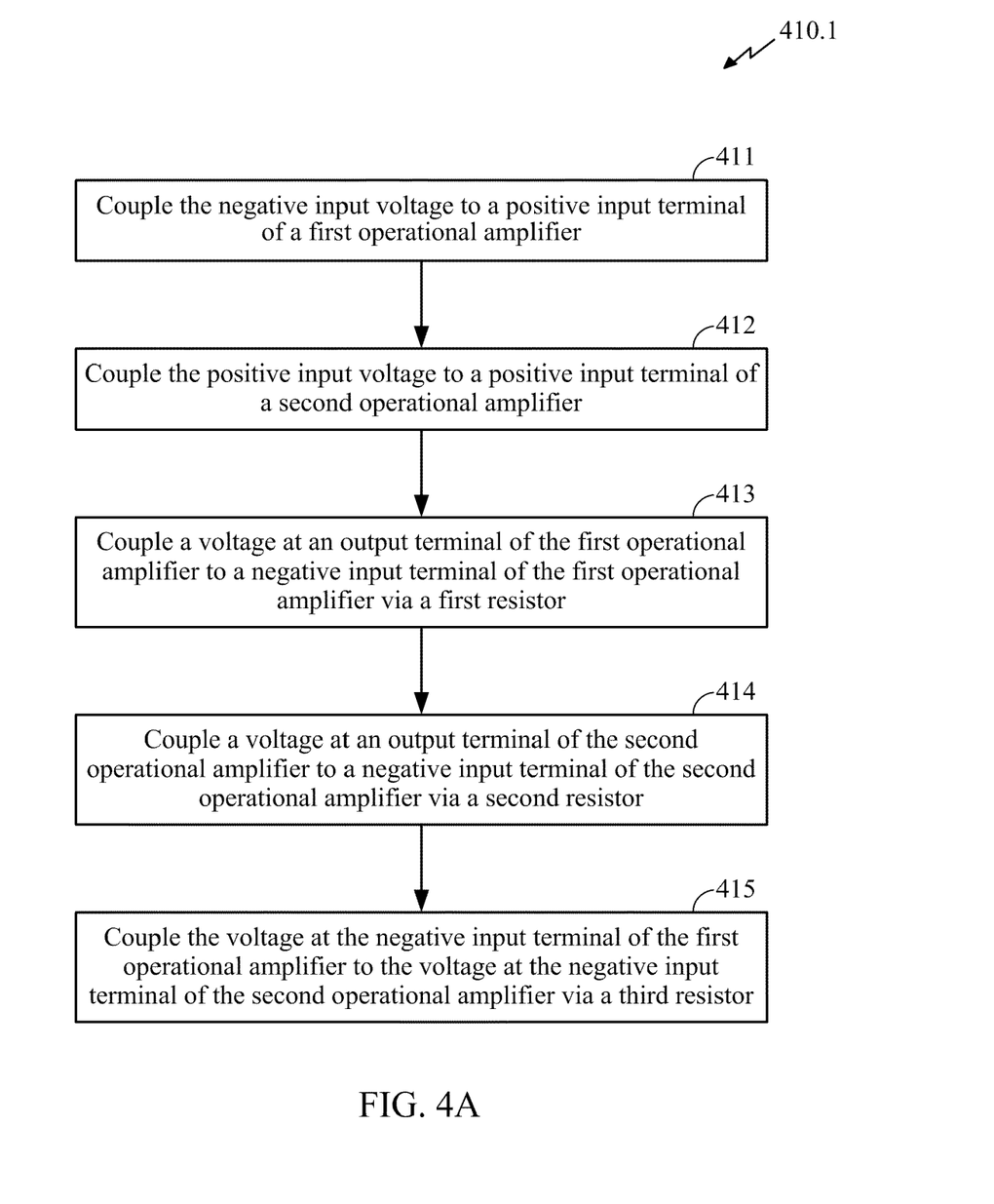
Figure 4B:
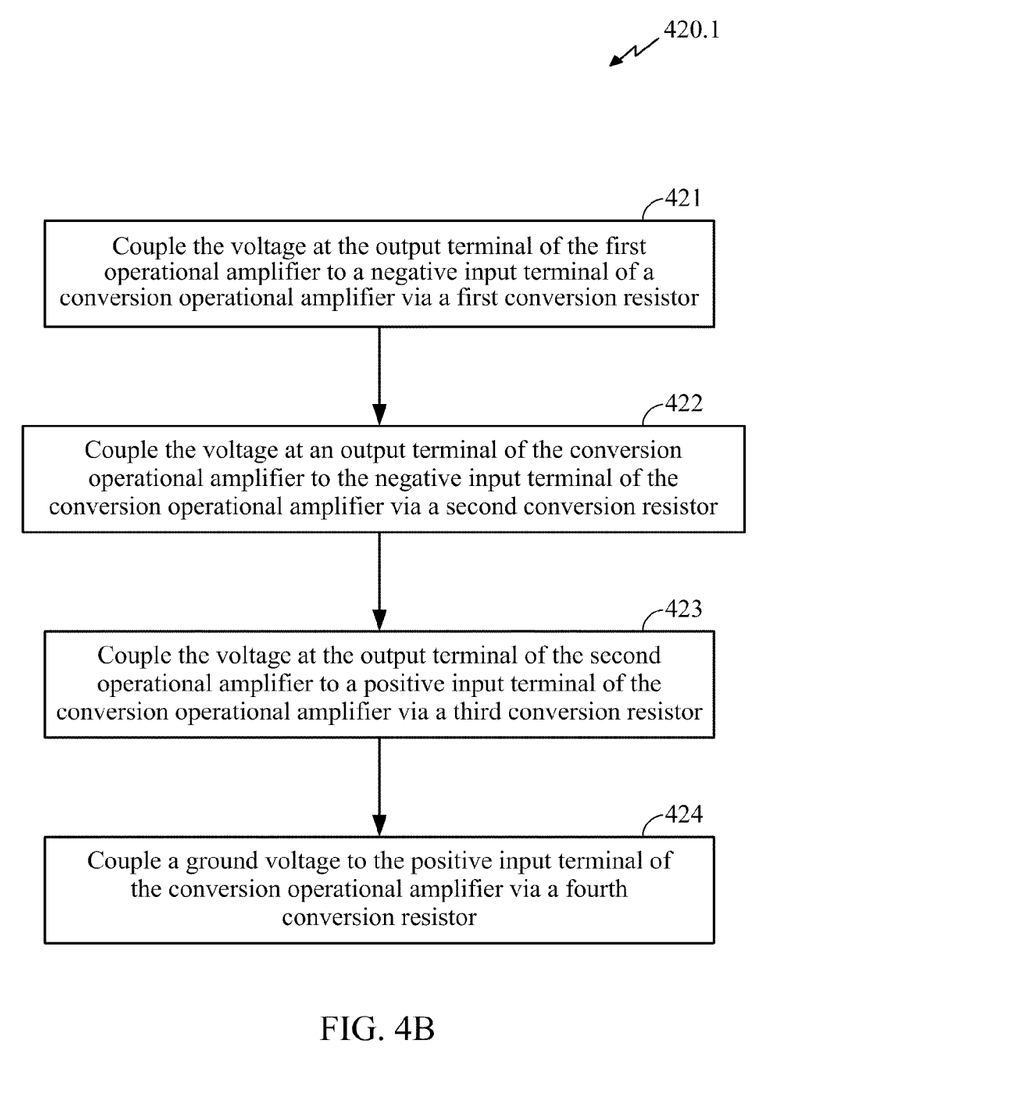

FIGS. 4, 4A, and 4B illustrate an exemplary embodiment 400 of a method according to the present disclosure. Note the exemplary embodiment is given for illustrative purposes only, and is not meant to limit the scope of the present disclosure to any particular method disclosed.

At block 410, the differential voltage signal is amplified with a gain to generate a differential output voltage.

At block 420, the differential output voltage is converted to a single-ended output voltage proportional to the differential output voltage.

FIG. 4A illustrates an exemplary embodiment 410.1 of block 410 in FIG. 4.

At block 411, the negative input voltage is coupled to a positive input terminal of a first operational amplifier.

At block 412, the positive input voltage is coupled to a positive input terminal of a second operational amplifier.

At block 413, a voltage at an output terminal of the first operational amplifier is coupled to a negative input terminal of the first operational amplifier via a first resistor;

At block 414, a voltage at an output terminal of the second operational amplifier is coupled to a negative input terminal of the second operational amplifier via a second resistor.

At block 415, the voltage at the negative input terminal of the first operational amplifier is coupled to the voltage at the negative input terminal of the second operational amplifier via a third resistor.

FIG. 4B illustrates an exemplary embodiment 420.1 of block 420 in FIG. 4.

At block 421, the voltage at the output terminal of the first operational amplifier is coupled to a negative input terminal of a conversion operational amplifier via a first conversion resistor.

At block 422, the voltage at an output terminal of the conversion operational amplifier is coupled to the negative input terminal of the conversion operational amplifier via a second conversion resistor.

At block 423, the voltage at the output terminal of the second operational amplifier is coupled to a positive input terminal of the conversion operational amplifier via a third conversion resistor.

At block 424, a ground voltage is coupled to the positive input terminal of the conversion operational amplifier via a fourth conversion resistor.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An on-chip instrumentation amplifier for converting a differential voltage signal to a single-ended output voltage signal during testing of on-chip components, comprising:
   a plurality of switchable feedback paths associated with a discrete plurality of gain settings, each gain setting being defined by having (i) a negative input voltage of the differential voltage signal received at a positive input terminal of a first operational amplifier, (ii) a positive input voltage of the differential voltage signal received at a positive input terminal of a second operational amplifier, (iii) a negative input terminal of the first operational amplifier coupled via a first switch S1 to a programmably selected one of a first node of each switchable feedback path, and (iv) a negative input terminal of the second operational amplifier coupled via a switch S2 to a programmably selected one of a second node of each switchable feedback path,
   wherein each switchable feedback path has a predefined corresponding feedback resistance $Rn.1$ and a corresponding shunt resistance $Rn.2$, where the values $Rn.2$ for each switchable feedback path is different than that of the other switchable feedback paths.

2. The on-chip instrumentation amplifier of claim 1, further comprising a differential-to-single-ended conversion block including a conversion operational amplifier having a positive input terminal, a negative input terminal, and an output terminal, the negative input terminal of the conversion operational amplifier coupled to the output terminal of the first operational amplifier via a first conversion resistor, the negative input terminal of the conversion operational amplifier coupled to the output terminal of the conversion operational amplifier via a second conversion resistor, the positive input terminal of the conversion operational amplifier coupled to the output terminal of the second operational amplifier via a third conversion resistor, and the positive input terminal of the conversion amplifier further coupled to ground via a fourth conversion resistor.

3. The on-chip instrumentation amplifier of claim 2, where the first conversion resistor has a nominal resistance equal to that of the second conversion resistor.

4. The on-chip instrumentation amplifier of claim 3, where the third and fourth conversion resistors have a nominal resistance equal to one-half of that of the first conversion resistor.

5. The on-chip instrumentation amplifier of claim 1, wherein the ratio $\alpha$ of Rn.1 and Rn.2 for each switchable feedback path eliminates DC offset correction during testing.

6. The on-chip instrumentation amplifier of claim 1, wherein the corresponding feedback resistance Rn.1 of each switchable feedback path is defined by a corresponding first resistor and a second resistor.

7. The on-chip instrumentation amplifier of claim 6, wherein the first resistor has a nominal resistance equal to that of its corresponding second resistor in each switchable feedback path.

8. The on-chip instrumentation amplifier of claim 1, wherein the corresponding feedback resistance Rn.1 of each switchable feedback path is defined by a corresponding first resistor and a second resistor, and the shunt resistance is defined by a corresponding third resistor, and where the nominal sum of the resistances of the first, second and third resistors is the same for each switchable feedback path.

9. In an on-chip instrumentation amplifier that converts a differential voltage signal to a single-ended output voltage signal during testing of on-chip components, comprising a plurality of switchable feedback paths, each gain setting being defined by having (i) a negative input voltage of the differential voltage signal received at a positive input terminal of a first operational amplifier, (ii) a positive input voltage of the differential voltage signal received at a positive input terminal of a second operational amplifier, (iii) a negative input terminal of the first operational amplifier coupled via a first switch S1 to a programmably selected one of a first node of each switchable feedback path, and (iv) a negative input terminal of the second operational amplifier coupled via a switch S2 to a programmably selected one of a second node of each switchable feedback path, wherein each switchable feedback path has a predefined corresponding feedback resistance Rn.1 and a corresponding shunt resistance Rn.2, where the values Rn.2 for each switchable feedback path is different than that of the other switchable feedback paths, a method comprising:

identifying a desired gain setting value; and selectably programming S1 and S2 to select one of the plurality of switchable feedback paths providing the desired gain setting value.

* * * * *